United States Patent
Shimizu et al.

(10) Patent No.: US 6,756,182 B2
(45) Date of Patent: Jun. 29, 2004

(54) CHARGED-PARTICLE-BEAM MICROLITHOGRAPHY METHODS EXHIBITING REDUCED COULOMB EFFECTS

(75) Inventors: Sumito Shimizu, Tokyo (JP); Kazuaki Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 13 days.

(21) Appl. No.: 10/170,040

(22) Filed: Jun. 11, 2002

(65) Prior Publication Data

US 2002/0187411 A1 Dec. 12, 2002

(30) Foreign Application Priority Data

Jun. 11, 2001 (JP) .......................................... 2001-175441

(51) Int. Cl.[7] ................................................ G03C 5/00
(52) U.S. Cl. ........................ 430/296; 430/30; 430/942
(58) Field of Search ................................ 430/296, 942, 430/30

(56) References Cited

PUBLICATIONS

Suzuki et al., "Nikon EB stepper: its system concept and countermeasures for critical issues," *Emerging Lithographic Technologies IV*, vol. 3997:214–224, 2000.

*Primary Examiner*—Christopher G. Young
(74) *Attorney, Agent, or Firm*—Klarquist Sparkman, LLP

(57) ABSTRACT

Methods are disclosed for performing charged-particle-beam (CPB, e.g., electron-beam) microlithography with reduced Coulomb effects being manifest in pattern images as formed on the surface of a sensitive substrate. The pattern is defined on a segmented reticle, which can be a scattering-stencil reticle or scattering-membrane reticle. In an embodiment, the beam current actually reaching the substrate, as a proportion of beam current actually passing through the reticle, is reduced to 50% or less during exposure of the pattern. To achieve this reduction, the pattern as defined on the reticle can be normal or inverted in tone as required, and the resist on the substrate can be positive or negative in tone as required. In an example embodiment, the beam current reaching the substrate is reduced by establishing an opening ratio of 50% or less for the pattern as a whole as defined on the reticle. The opening ratio is expressed as $100[A_{ws}/(A_{ws}+A_{hs})]$, wherein $A_{hs}$ is a total area of the reticle occupied by both the weakly scattering reticle membrane and the highly scattering layer, and $A_{ws}$ is a total area of the reticle occupied by only the weakly scattering reticle membrane.

28 Claims, 7 Drawing Sheets

|  | η max | η min | Reticle Tone | Resist Tone |
|---|---|---|---|---|
| First Example | 40% | 30% | Normal Pattern | Negative |
| Second Example | 60% | 50% | Inverted Pattern | Positive |
| Third Example | 70% | 60% | Inverted Pattern | Positive |

FIG. 4

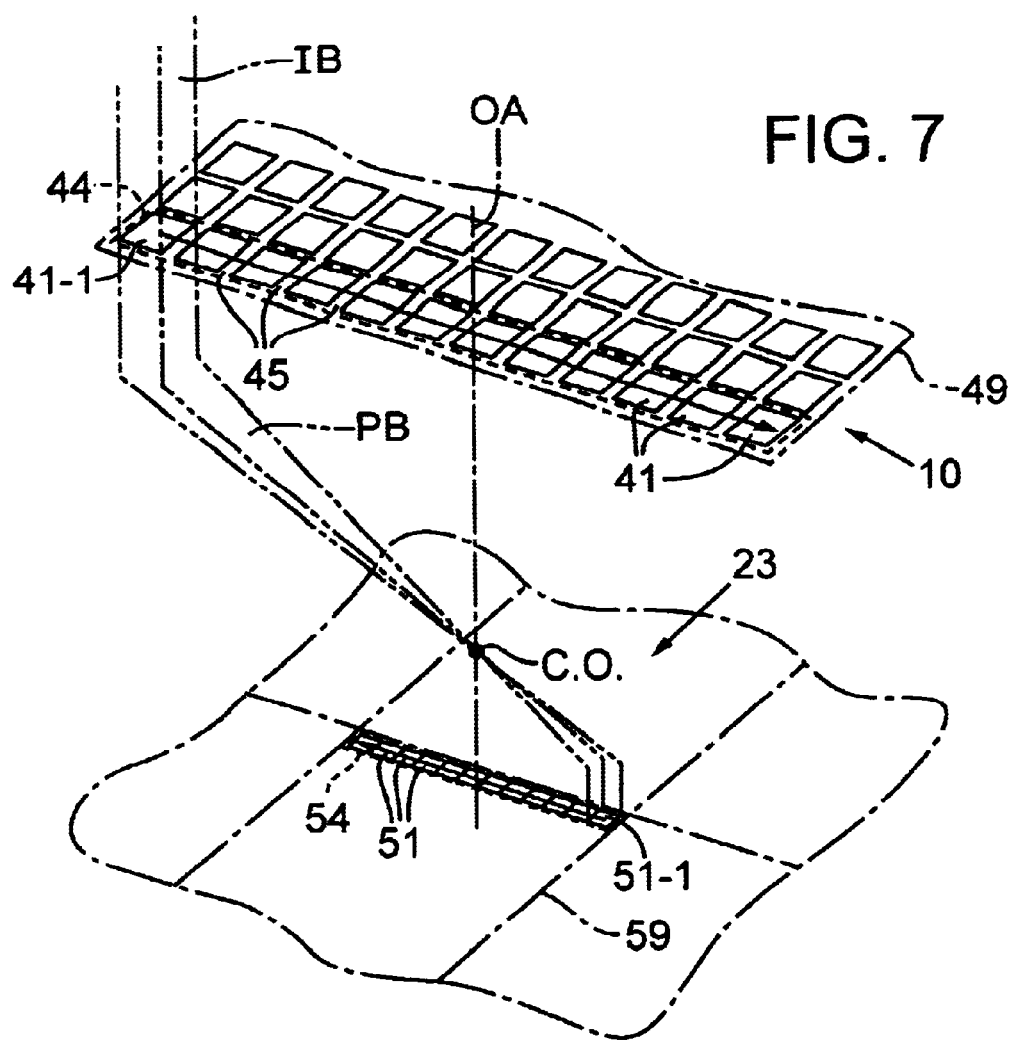

CHARGED-PARTICLE-BEAM MICROLITHOGRAPHY METHODS EXHIBITING REDUCED COULOMB EFFECTS

FIELD

This disclosure pertains to microlithography (transfer of a pattern to a sensitive substrate), especially as performed using a charged particle beam. Microlithography is a key technology used in the fabrication of microelectronic devices such as integrated circuits, displays, and micromachines. More specifically, the disclosure pertains to charged-particle-beam (CPB) microlithography of reticle patterns in a manner that reduces the so-called Coulomb effect.

BACKGROUND

Substantial development effort is being expended currently to develop a practical "next generation" microlithography technology capable of transferring fine patterns having minimum feature sizes of less than 0.1 $\mu$m (i.e., below the 0.1 $\mu$m rule). Among several microlithography techniques that have been considered, charged-particle-beam (CPB) microlithography (especially electron-beam microlithography) having a throughput sufficiently high for use in the mass production of semiconductor chips (especially memory chips) is an attractive candidate. This technique, termed "divided-reticle-reduction" electron-beam (EB) microlithography, uses an "EB stepper." In preliminary tests of a prototype EB stepper, divided-reticle-reduction EB microlithography has exhibited a capability of transferring patterns having critical dimensions of 0.1 $\mu$m or smaller.

Conventional EB microlithography techniques include the so-called "cell-projection" technique that differs from so-called "direct-write" techniques. In the cell-projection technique a desired pattern is formed on the substrate ("wafer") by projecting and connecting together basic pattern-element shapes termed "cells." A variety of such basic shapes are defined on an aperture plate upstream of the substrate, and the cells are selected and projected in a "mix-and-match" manner to reconstruct the pattern cell-by-cell on the substrate. Each cell typically is very small, e.g., about 5-$\mu$m square, requiring a very small-diameter beam.

In contrast to the "cell-projection" apparatus, an EB stepper configured to perform divided-reticle-reduction microlithography utilizes a reticle that defines pattern elements configured as the elements are to be projected onto the substrate. (Hence, "mix-and-match" reconstruction of pattern elements on the substrate, which is slow, is not required.) The EB stepper utilizes a reticle on which the pattern is divided into a large number of exposure units, usually termed "subfields," each defining a respective portion of the pattern. Each subfield typically is much larger (up to about 1-mm square on the reticle) than a single "cell," requiring a correspondingly larger-diameter beam. Hence, since more of the pattern is transferred in each exposure "shot," divided-reticle-reduction microlithography typically achieves a much higher throughput than cell-projection.

One type of reticle suitable for use in an EB stepper is a so-called "scattering-stencil" reticle. In a scattering-stencil reticle each subfield includes a respective portion of the reticle membrane, wherein the subfields are separated from one another by non-patterned regions occupied by support struts. The reticle membrane constitutes an electron-scattering body. In each subfield, the respective pattern elements are defined by a corresponding arrangement of apertures that freely transmit electrons of an incident beam. In other words, regions of the subfield in which electron transmission without scattering is desired are defined as respective apertures in the membrane, while the remaining regions of the membrane are respective regions in which electron transmission is accompanied by large forward-scattering. Most of the electrons that are forward-scattered during passage through the membrane are blocked by a downstream "scattering" aperture. Consequently, the electrons reaching the surface of the substrate are more or less exclusively the electrons that have passed through the apertures only.

Another reticle type used in divided-reticle-reduction EB microlithography is the so-called "scattering-membrane" reticle. A scattering-membrane reticle is divided into subfields in a manner similar to the scattering-stencil reticle. However, the membrane in the scattering-membrane reticle does not define pattern elements by corresponding apertures. Rather, the pattern elements are defined by corresponding regions of a highly scattering film formed on a relatively thin (thickness of 0.1 $\mu$m or less) membrane through which incident electrons pass with substantially no scattering.

Generally, the percentage of incident electrons passing through the membrane of a scattering-membrane reticle is about 40%. This seemingly low number does not prevent attainment of sufficient contrast for good imaging of the pattern on the substrate. However, such reticles do pose a risk of chromatic aberration caused by forward-scattering of electrons during passage through the membrane. Chromatic aberrations can affect pattern resolution adversely.

A key operational goal of EB steppers is an ability to perform mass-production of semiconductor wafers, especially high-density memory chips (e.g., DRAMs having a memory capacity of at least 16 Gbits). To achieve such performance, the EB stepper must exhibit a correspondingly high level of pattern resolution. Examples of factors that contribute to such resolution achieved by an EB stepper include: (1) high acceleration of the electron beam, (2) low geometrical aberrations, and (3) high suppression of Coulomb effects and other resolution-destroying effects by the EB optical system of the stepper. Reduction of Coulomb effects is very important. In an EB stepper, whereas it is desirable to increase the beam current as much as possible in order to maximize productivity, increasing the beam current correspondingly increases the density of electrons in the beam. In conditions of high electron density, the repulsive forces between adjacent electrons in the beam are stronger than in lower-density beams. The resulting mutual repulsion of electrons away from each other in the beam is termed the "Coulomb effect." During microlithography performed under such conditions, electrons reaching the surface of the substrate produce an image exhibiting a characteristic blur that degrades the resolution of the projected image.

SUMMARY

In view of the problems summarized above, the present invention provides, inter alia, charged-particle-beam (CPB) microlithography apparatus and methods that exhibit better control of Coulomb effects as manifest in a pattern as transferred from a segmented reticle to a sensitive substrate.

In one embodiment of the method, the segmented reticle can be either a scattering-stencil reticle or a scattering-membrane reticle. Selected regions of the reticle are individually illuminated with a CPB illumination beam to produce a corresponding patterned beam. Most of the charged particles in the patterned beam that are highly scattered during passage through the reticle are blocked by a contrast aperture from reaching the sensitive substrate. Meanwhile, charged particles that are not scattered and/or weakly scattered during passage through the reticle pass through the contrast aperture and are focused as a projected image on the sensitive substrate. For exposing the pattern, the beam current of the patterned beam reaching the sensitive substrate is reduced, relative to the beam current actually passing through the reticle, to 50% or less. This reduction is performed by: (a) establishing the pattern, as defined on the reticle, as a normal-tone pattern or as an inverted-tone pattern, and (b) establishing the resist on the substrate as a positive or negative resist.

If the reticle is a scattering-stencil reticle (in which the pattern elements are defined by respective non-scattering, CPB-transmissive apertures in a highly CPB-scattering reticle membrane), then, in step (a), above, the beam current reaching the sensitive substrate is reduced by establishing an opening ratio of 50% or less for the pattern as a whole as defined on the reticle. The opening ratio is expressed as: $100[A_o/(A_o+A_{hs})]$, wherein $A_o$ is the total area of the reticle occupied by the non-scattering apertures in the reticle membrane, and $A_{hs}$ is the total area of the reticle occupied by the highly scattering reticle membrane.

If the reticle is a scattering-membrane reticle (in which the pattern elements are defined by respective voids in a highly CPB-scattering layer on a weakly CPB-scattering yet CPB-transmissive reticle membrane), then, in step (a), above, the beam current reaching the sensitive substrate is reduced by establishing an opening ratio of 50% or less for the pattern as a whole as defined on the reticle. The opening ratio is expressed as $100[A_{ws}/(A_{ws}+A_{hs})]$, wherein $A_{hs}$ is the total area of the reticle occupied by both the weakly scattering reticle membrane and the highly scattering layer, and $A_{ws}$ is the total area of the reticle occupied by only the weakly scattering reticle membrane.

If the pattern as defined on the reticle cannot be established as a normal-tone or inverted-tone pattern so as to reduce the beam current to 50% or less, then either of the following can be performed: (1) splitting the reticle into multiple complementary reticles each defining a respective portion of the pattern, or (2) defining the pattern using a scattering-membrane reticle.

In another embodiment of the method, the pattern is defined on a segmented reticle that is either a scattering-stencil reticle or a scattering-membrane reticle. Selected regions of the reticle are individually illuminated with a CPB illumination beam to produce a corresponding patterned beam. At least most of the charged particles in the patterned beam that are highly scattered during passage through the reticle are blocked from reaching the sensitive substrate. Charged particles that are not scattered and/or that are weakly scattered during passage through the reticle are focused as a projected image on the sensitive substrate. With respect to regions of the reticle defining critical features of the pattern, the beam current of the patterned beam reaching the sensitive substrate is reduced, relative to a beam current actually passing through the reticle, to 50% or less by establishing the pattern, as defined on the reticle, as a normal-tone pattern or as an inverted-tone pattern, and by establishing the resist on the substrate as a positive or negative resist.

If the reticle is a scattering-stencil reticle, then the beam current reaching the sensitive substrate can be reduced, with respect to regions of the reticle defining critical features of the pattern, by establishing an opening ratio of 50% or less for the pattern as a whole as defined on the reticle. The opening ratio is expressed as $100[A_o/(A_o+A_{hs})]$, wherein $A_o$ is a total area of the reticle occupied by the non-scattering apertures in the reticle membrane, and $A_{hs}$ is a total area of the reticle occupied by the highly scattering reticle membrane.

If the reticle is a scattering-membrane reticle, then the beam current reaching the sensitive substrate can be reduced, with respect to regions of the reticle defining critical features of the pattern, by establishing an opening ratio of 50% or less for the pattern as a whole as defined on the reticle. The opening ratio is expressed as $100[A_{ws}/(A_{ws}+A_{hs})]$, wherein $A_{hs}$ is a total area of the reticle occupied by both the weakly scattering reticle membrane and the highly scattering layer, and $A_{ws}$ is a total area of the reticle occupied by only the weakly scattering reticle membrane.

If the pattern as defined on the reticle cannot be established as a normal-tone or inverted-tone pattern so as to reduce the beam current to 50% or less, then either the reticle can be split into multiple complementary reticles each defining a respective portion of the pattern, or the pattern can be defined using a scattering-membrane reticle.

In yet another embodiment of a method for performing CPB microlithography, the pattern is defined on a segmented reticle that is either a scattering-stencil reticle or a scattering-membrane reticle. The reticle is divided into multiple subfields each defining a respective portion of the pattern. The subfields are individually illuminated using a CPB illumination beam to produce a corresponding patterned beam directed to the sensitive substrate. At least most of the charged particles in the patterned beam that are highly scattered during passage through the reticle are blocked from reaching the sensitive substrate. Charged particles that are not scattered and/or weakly scattered during passage through the reticle are projected as a projected image on the sensitive substrate. The subfield images are stitched together on the substrate so as to imprint a complete pattern on the substrate. For exposing the pattern, the beam current of the patterned beam reaching the sensitive substrate is reduced, relative to a beam current actually passing through the reticle, to 50% or less. This reduction is achieved by establishing the pattern, as defined on the reticle, as a normal-tone pattern or as an inverted-tone pattern, and establishing the resist on the substrate as a positive or negative resist. According to an exposure rule, the pattern is defined in a normal tone on the reticle and a negative resist is used on the substrate whenever $(\eta_{max}+\eta_{min})/2 \leq 50\%$. In this expression, $\eta$ is a mean pattern-element density for the entire pattern, $\eta_{max}$ is a maximum pattern-element density for each subfield, and $\eta_{min}$ is a minimum pattern-element density for each subfield. Alternatively, the pattern is defined in an inverted tone on the reticle and a positive resist is used on the substrate whenever $(\eta_{max}+\eta_{min})/2 > 50\%$.

If the pattern as defined on the reticle cannot be established as a normal-tone or inverted-tone pattern, then the reticle can be split into multiple complementary reticles each defining a respective portion of the pattern. In this instance, each of the complementary reticles is exposed according to the exposure rule.

The method can include the step of changing the pattern-element density on the reticle by disposing dummy elements and/or unresolvable elements on the reticle.

According to yet another embodiment of a microlithography method, the pattern is defined on a segmented reticle that is either a scattering-stencil reticle or a scattering-membrane reticle. The reticle is divided into multiple subfields each defining a respective portion of the pattern. The subfields are individually illuminated with a CPB illumination beam to produce a corresponding patterned beam directed to the sensitive substrate. At least most of the charged particles in the patterned beam that are highly scattered during passage through the reticle are blocked from reaching the sensitive substrate. Charged particles that are not scattered and/or weakly scattered during passage through the reticle are projected as a projected image on the sensitive substrate. The subfield images are stitched together on the substrate so as to imprint a complete pattern on the substrate. With respect to subfields defining critical features of the pattern, a beam current of the patterned beam reaching the sensitive substrate is reduced, relative to a beam current actually passing through the reticle, to 50% or less. This reduction is achieved by establishing the pattern, as defined on the reticle, as a normal-tone pattern or as an inverted-tone pattern, and establishing the resist on the substrate as a positive or negative resist. The pattern is defined in a normal tone on the reticle and a negative resist is used on the substrate whenever $(\eta_{cmax}+\eta_{cmin})/2 \leq 50\%$. In this expression $\eta_c$ is a mean pattern-element density for all subfields of the pattern that include critical features, $\eta_{cmax}$ is a maximum pattern-element density for each subfield that includes critical features, and $\eta_{cmin}$ is a minimum pattern-element density for each subfield that includes critical features. The pattern is defined in an inverted tone on the reticle and a positive resist is used on the substrate whenever $(\eta_{cmax}+\eta_{cmin})/2 > 50\%$.

The foregoing and additional features and advantages of the invention will be more readily apparent from the following detailed description, which proceeds with reference to the accompanying drawings.

BRIEF DESCRIPTION OF THE DRAWINGS

FIG. 4 is a table of data corresponding to three examples, pertaining to the third representative embodiment of an exposure method, involving establishing appropriate reticle tone and resist tone for various values of $\eta_{max}$ and $\eta_{min}$.

FIG. 7 is a perspective view depicting certain aspects of pattern transfer from a divided reticle, such as the reticle shown in FIGS. 6(A)–6(B), to a substrate (wafer).

DETAILED DESCRIPTION

The invention is described below in the context of representative embodiments that are not intended to be limiting in any way. Also, the embodiments are described in the context of using an electron beam as an exemplary charged particle beam. However, it will be understood that the principles as described herein are applicable with equal facility to use of another type of charged particle beam as a lithographic energy beam, such as an ion beam.

Electron-beam Microlithography System and Method

Figure 5:
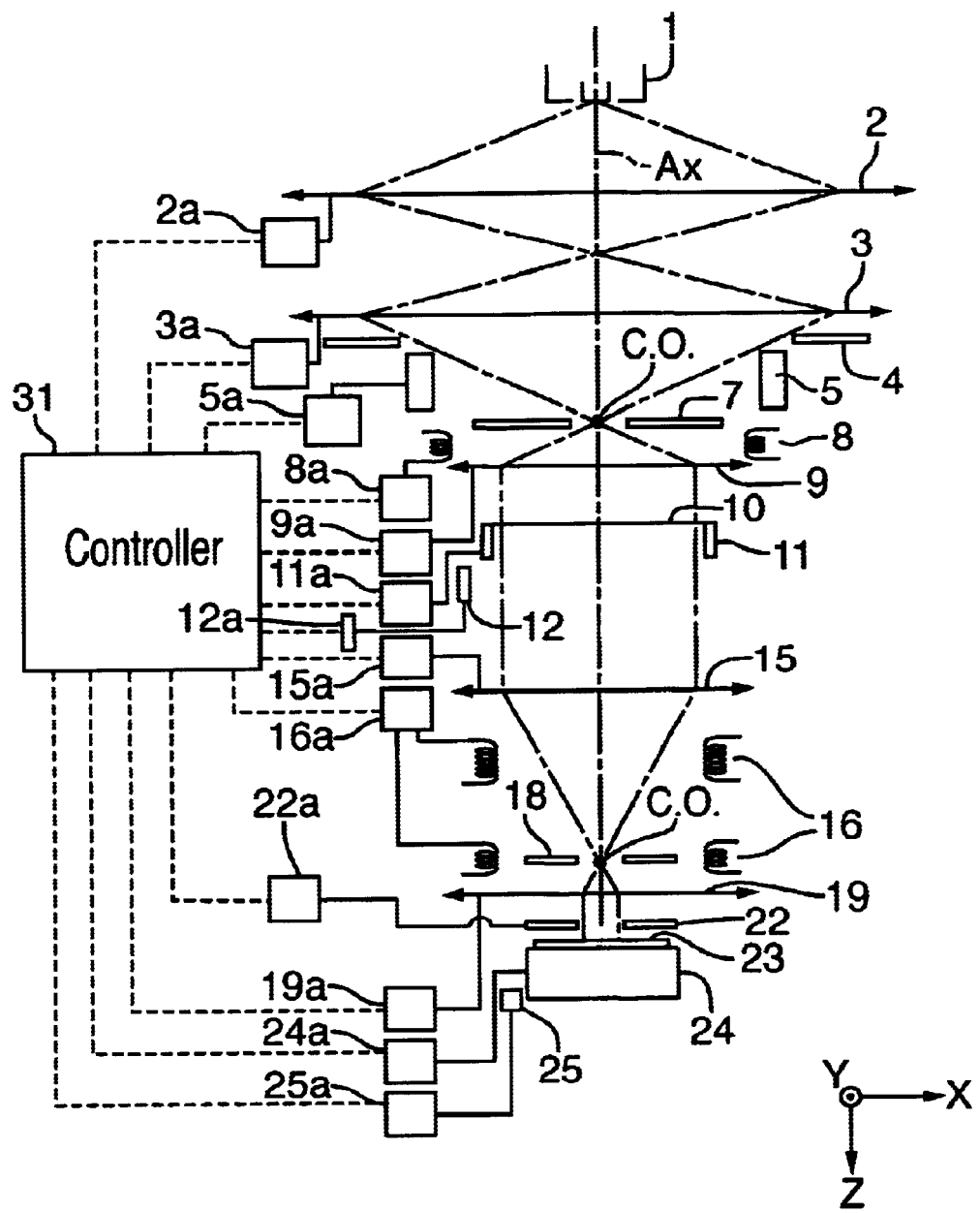
FIG. 5 is an elevational schematic diagram showing certain imaging and control relationships in an embodiment of an electron-beam microlithography apparatus, as discussed herein, utilizing a divided reticle.

First, an embodiment of an electron-beam projection-exposure (microlithography) apparatus and method, employing a divided reticle, is provided below, referring to FIG. 5. FIG. 5 also depicts general imaging and control relationships of the subject system.

Situated at the extreme upstream end of the system is an electron gun 1 that emits an electron beam propagating in a downstream direction generally along an optical axis Ax. Downstream of the electron gun 1 are a first condenser lens 2 and a second condenser lens 3 collectively constituting a two-stage condenser-lens assembly. The condenser lenses 2, 3 converge the electron beam at a crossover C.O. situated on the optical axis Ax at a blanking diaphragm 7.

Downstream of the second condenser lens 3 is a "beam-shaping diaphragm" 4 comprising a plate defining an axial aperture (typically rectangular or square in profile) that trims and shapes the electron beam passing through the aperture. The aperture is sized and configured to trim the electron beam sufficiently to illuminate one exposure unit (subfield) on the reticle 10. An image of the beam-shaping diaphragm 4 is formed on the reticle 10 by an illumination lens 9.

The electron-optical components situated between the electron gun 1 and the reticle 10 collectively constitute an "illumination-optical system" of the depicted microlithography system. The electron beam propagating through the illumination-optical system is termed an "illumination beam" because it illuminates a desired region of the reticle 10. As the illumination beam propagates through the illumination-optical system, the beam actually travels in a downstream direction through an axially aligned "beam tube" (not shown but well understood in the art) that can be evacuated to a desired vacuum level.

A blanking deflector 5 is situated downstream of the beam-shaping aperture 4. The blanking deflector 5 laterally deflects the illumination beam as required to cause the illumination beam to strike the aperture plate of the blanking diaphragm 7, thereby preventing the illumination beam from being incident on the reticle 10 during blanking.

A subfield-selection deflector 8 (a primary deflector of the illumination-optical system) is situated downstream of the blanking diaphragm 7. The subfield-selection deflector 8 laterally deflects the illumination beam as required to illuminate a desired reticle subfield situated within the optical field of the illumination-optical system. Thus, subfields of the reticle 10 are scanned sequentially by the illumination beam in a horizontal direction (X direction in the figure). The illumination lens 9 is situated downstream of the subfield-selection deflector 8.

The reticle 10 extends in a plane (X-Y plane) that is perpendicular to the optical axis Ax. The reticle 10 typically defines many subfields (e.g., thousands of subfields). The subfields collectively define the pattern for a layer to be formed at a single die ("chip") on a lithographic substrate, wherein each subfield defines a respective portion of the pattern. (The subfields collectively defining an entire pattern can be located on a single reticle or divided between multiple reticles.) Alternatively to defining an entire chip pattern on a single reticle, it is possible to split the chip pattern among multiple reticles each defining a respective portion of the chip pattern.

The reticle 10 is mounted on a movable reticle stage 11. Using the reticle stage 11, by moving the reticle 10 in a direction (Y and/or X direction) perpendicular to the optical axis Ax, it is possible to illuminate the respective subfields on the reticle 10 extending over a range that is wider than the optical field of the illumination-optical system. The position of the reticle stage 11 in the X-Y plane is determined using a "position detector" 12 typically configured as a laser interferometer. A laser interferometer is capable of measuring the position of the reticle stage 11 with extremely high accuracy in real time.

Situated downstream of the reticle 10 but upstream of a substrate 23 is the "projection-optical system" portion of the electron-optical system. The projection-optical system comprises first and second projection lenses 15, 19, respectively, an imaging-position deflector 16, and a contrast-aperture diaphragm 18. The illumination beam, by passage through an illuminated subfield of the reticle 10, becomes a "patterned beam" because the beam carries an aerial image of the illuminated subfield. The patterned beam is imaged at a specified location on the substrate 23 (e.g., "wafer") by the projection lenses 15, 19 collectively functioning as a "projection-lens assembly."

To ensure imaging at the proper location, the imaging-position deflector 16 imparts the required lateral deflection of the patterned beam. As a primary deflector of the projection-optical system, the imaging-position deflector 16 can deflect the patterned beam laterally over a relatively wide angular range (relative to the axis Ax). The imaging-position deflector 16 typically is configured as an electromagnetic deflector.

So as to be imprintable with the image carried by the patterned beam, the upstream-facing surface of the substrate 23 is coated with a suitable "resist" that is imprintably sensitive to exposure by the patterned beam. When forming the image on the substrate 23, the projection-lens assembly "reduces" (demagnifies) the aerial image. Thus, the image as formed on the substrate 23 is smaller (usually by a defined integer-ratio factor termed the "demagnification factor") than the corresponding region illuminated on the reticle 10. By thus causing imprinting on the surface of the substrate 23, the apparatus of FIG. 5 achieves "transfer" of the pattern image from the reticle 10 to the substrate 23.

The substrate 23 is situated on a substrate stage 24 situated downstream of the projection-optical system. As the patterned beam propagates through the projection-optical system, the beam actually travels in a downstream direction through an axially aligned "beam tube" (not shown but well understood in the art) that can be evacuated to a desired vacuum level.

The projection-optical system forms a crossover C.O. of the patterned beam on the optical axis Ax at the rear focal plane of the first projection lens 15. The position of the crossover C.O. on the optical axis Ax is a point at which the axial distance between the reticle 10 and substrate 23 is divided according to the demagnification ratio. Situated at the crossover C.O. (i.e., the rear focal plane) is the contrast-aperture diaphragm 18. The contrast-aperture diaphragm 18 comprises an aperture plate that defines an aperture centered on the axis Ax. With the contrast-aperture diaphragm 18, electrons of the patterned beam that were scattered during transmission through the reticle 10 are blocked so as not to reach the substrate 23.

The substrate 23 is mounted to the substrate stage 24 via a wafer chuck (not shown but well understood in the art), which presents the upstream-facing surface of the substrate 23 in an X-Y plane. The wafer chuck typically is an electrostatic chuck. The substrate stage 24 (with chuck and substrate 23) is movable in the X and Y directions. Thus, by simultaneously scanning the reticle stage 11 and the substrate stage 24 in mutually opposite directions in a synchronous manner, it is possible to transfer each subfield within the optical field of the illumination-optical system as well as each subfield outside the optical field to corresponding regions on the substrate 23. The substrate stage 24 also includes a "position detector" 25 configured similarly to the position detector 12 of the reticle stage 11.

The relative positional relationship of the reticle 10 and substrate 23 can be ascertained by scanning marks on the substrate 23 with a beam that has passed through corresponding marks on the reticle 10, and detecting the electrons that are backscattered from the marks on the substrate.

A backscattered-electron (BSE) detector 22 is situated immediately upstream of the substrate 23. The BSE detector 22 is configured to detect and quantify electrons backscattered from the alignment mark on the substrate 23 (or from a mark situated on the upstream-facing surface of the substrate stage 24). By detecting backscattered electrons from the alignment mark on the substrate 23, it is possible to determine the relative positional relationship of the reticle 10 and the substrate 23. The alignment mark on the substrate 23 can be scanned by a beam that has passed through a corresponding mark pattern on the reticle 10.

Each of the lenses 2, 3, 9, 15, 19 and deflectors 5, 8, 16 is controlled by a controller 31 via a respective coil-power controller 2a, 3a, 9a, 15a, 19a and 5a, 8a, 16a. Similarly, the reticle stage 11 and substrate stage 24 are controlled by the controller 31 via respective stage drivers 11a, 24a. The position detectors 12, 25 produce and route respective stage-position signals to the controller 31 via respective interfaces 12a, 25a each including amplifiers, analog-to-digital (A/D) converters, and other circuitry for achieving such ends. In addition, the BSE detector 22 produces and routes signals to the controller 31 via a respective interface 22a.

From the respective data routed to the controller 31, as a subfield is being transferred the controller 31 ascertains, inter alia, any control errors of the respective stage positions. To correct such control errors, the imaging-position deflector 16 is energized appropriately to deflect the patterned beam. Thus, a reduced image of the illuminated subfield on the reticle 10 is transferred accurately to the desired target position on the substrate 23. This real-time correction is made as each respective subfield image is transferred to the substrate 23, and the subfield images are positioned such that they are stitched together properly on the substrate 23.

Divided Reticle

Figure 6A:
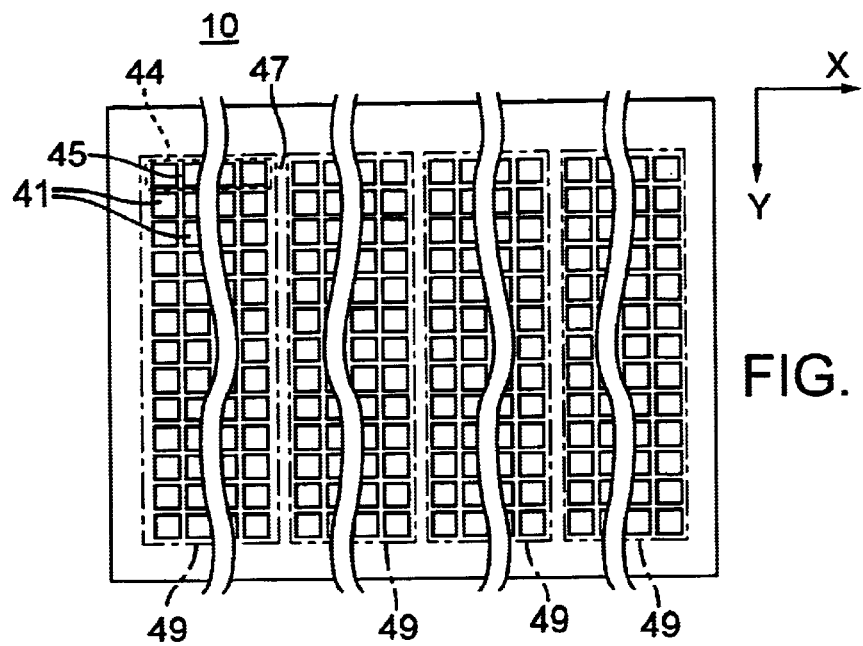
FIG. 6(A) is a schematic plan view of an exemplary segmented reticle.
Figure 6B:
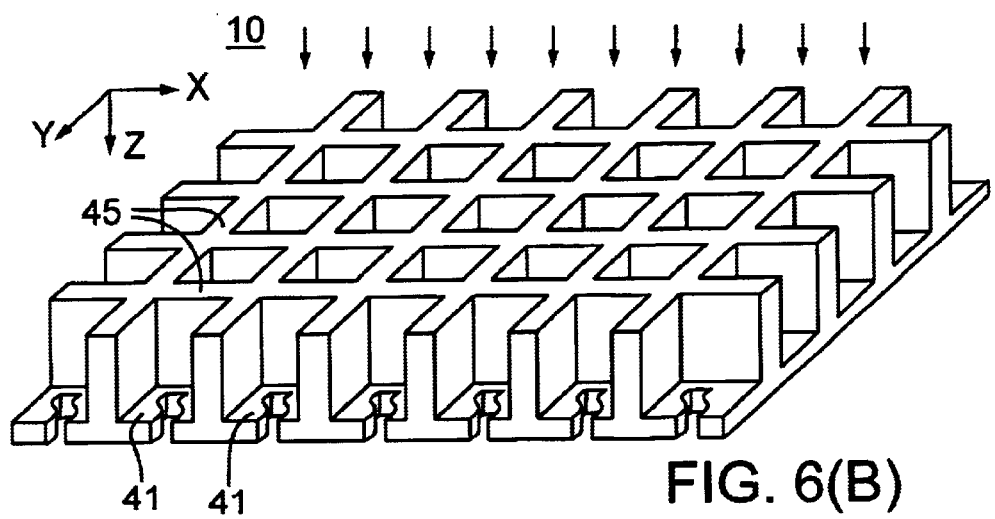
FIG. 6(B) is an oblique view of a portion of the reticle shown in FIG. 6(A), particularly illustrating the configuration of grillage and subfields.
Figure 6C:
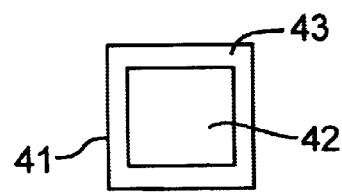
FIG. 6(C) is a schematic plan view of a membrane portion including a single subfield of the reticle of FIG. 6(A).

Details of an exemplary divided reticle 10 usable with the system of FIG. 5 are shown in FIGS. 6(A)–6(C). FIG. 6(A) is a plan view, FIG. 6(B) is an oblique view of a portion of the reticle, and FIG. 6(C) is a plan view of a membrane portion including a single subfield. The depicted reticle 10 can be manufactured by electron-beam direct writing and etching of a silicon wafer, for example.

FIG. 6(A) shows the general configuration of the entire reticle 10. In the figure, multiple regions 49 are shown each including a large respective array of membrane portions 41. The regions 49 are termed "stripes," and each stripe 49 extends in the Y direction. Each stripe 49 includes multiple rows 44 of membrane portions 41, wherein each row 44 extends in the X direction. Each membrane portion 41 comprises a respective subfield. Depending somewhat upon the particular type of reticle (stencil reticle or scattering-membrane reticle), the membrane has a thickness of, e.g., 0.1 $\mu$m to several $\mu$m. In the depicted configuration, the membrane portions 41 in each row 44, and the rows 44 in each stripe 49, are separated from each other by respective "minor struts" 45. The stripes 49 are separated from each other by major struts 47.

As shown in FIG. 6(C), each membrane portion 41 comprises a respective subfield (pattern-defining region) 42 surrounded by a skirt 43. In a particular membrane portion 41, the respective subfield 42 defines the pattern features of the respective portion of the pattern. The skirt 43 is not patterned. During exposure of a particular subfield 42, only the respective pattern-defining region is transferred; the respective skirt 43 is not transferred. The edges of the illumination beam incident on the subfield fall within the respective skirt 43.

As discussed above, the reticle 10 can be a stencil type or a scattering-membrane type. In a stencil-type reticle, pattern elements are defined by corresponding apertures in the reticle membrane. In a scattering-membrane reticle, pattern elements are defined by respective "scattering bodies" formed on the reticle membrane. Either type of reticle 10 can be used with the apparatus of FIG. 5, for example.

The currently practicable size of a subfield 42 is approximately 0.5 to 5 mm square on the reticle 10. At a demagnification ratio of 1/5, for example, the size of the reduced subfield image as projected onto the substrate 23 is approximately 0.1 to 1 mm square.

The minor struts 45 intersect with each other at right angles to form a lattice of "grillage" that strengthens and confers rigidity to the reticle 10. By way of example, the minor struts 45 are each about 0.5 to 1 mm thick (in the Z direction) and about 0.1 mm wide (in the X or Y direction); the skirt 43 is about 0.05 mm wide, for example. The grillage includes the major struts 47 that confer additional rigidity and strength to the reticle 10. The major struts 47 are contiguous with the minor struts 45.

The rows 44 shown in FIG. 6(A) are also known as "electrical stripes" because exposure of each row involves an electrically induced deflection of the illumination and patterned beams using the subfield-selection and imaging-position deflectors 8, 16, respectively. Similarly, the stripes 49 shown in FIG. 6(A) are also known as "mechanical stripes" because exposure of a full stripe 49 involves mechanical movement of the reticle 10 and substrate 23 by the reticle stage 1 and substrate stage 24, respectively. Hence, multiple membrane portions 41 are arrayed in the X direction in the figure to form each electrical stripe 44, and multiple electrical stripes 44 are arrayed in the Y direction to form each mechanical stripe 49. The length of an electrical stripe 44 (equal to the width of the corresponding mechanical stripe 49) corresponds to the width of the optical field of the illumination-optical system (which corresponds to the width of a range of deflection achievable by the subfield-selection deflector 8).

As an alternative to the reticle configuration shown in FIGS. 6(A)–6(C), a segmented reticle can comprise electrical stripes in which the respective membrane portions (and hence the subfields) are not separated from each other. In other words, in such an alternative reticle, the constituent subfields of each electrical stripe are contiguous with each other with no intervening minor struts 45 or skirts 43. However, minor struts 45 (and skirts) are still present between adjacent electrical stripes of a mechanical stripe, and major struts 47 are still present between adjacent mechanical stripes. During exposure of this type of segmented reticle, the constituent subfields of an electrical stripe are exposed in a continuous (or sequential) lateral scanning sweep of the illumination beam along the electrical stripe.

According to an effective exposure method, and referring further to the reticle 10 shown in FIG. 6(A), the subfields 42 in a selected electrical stripe 44 within a selected mechanical stripe 49 are sequentially illuminated by appropriate deflections of the illumination beam in the X direction. Successive electrical stripes 44 in the selected mechanical stripe 49 are exposed by continuous scanning motions of the stages 11, 24.

Exposure of Divided Reticle

General aspects of the exposure process summarized above are shown in FIG. 7. Shown at the upper portion of the figure is an end of one mechanical stripe 49 on the reticle 10, wherein the end is shown containing three electrical stripes 44. As described above, each electrical stripe 44 contains multiple constituent membrane portions 41 (respective subfields 42 and skirts 43 are not shown) separated from each other by intervening minor struts 45. Minor struts 45 also separate individual electrical stripes 44 from each other in the mechanical stripe 49. Downstream of the reticle 10 along the optical axis OA is a corresponding region of the substrate 23 situated in opposition to the reticle. In the figure, the subfield in the membrane portion 41-1 in the left corner of the electrical stripe 44 nearest the viewer is being illuminated by the illumination beam IB propagating from upstream. The resulting patterned beam PB downstream of the illuminated subfield is being exposed (by the projection-lens assembly 15, 19, not shown) onto a corresponding region 51-1 on the surface of the substrate 23. As can be seen, the image in the region 51-1 is reduced (demagnified) relative to the corresponding subfield in the corresponding membrane portion 41-1. The position of the region on the substrate surface at which the image is formed is achieved by action of the imaging-position deflector 16 (FIG. 5).

Between the reticle 10 and the substrate 23, the patterned beam PB is deflected twice by the collective action of the projection lenses 15, 19. The first deflection (performed by the first projection lens 15) is from a direction parallel to the optical axis OA to a direction in which the patterned beam intersects the optical axis OA. The second deflection (performed by the second projection lens 19) is a reverse of the first deflection.

The exact position 51 on the surface of the substrate 23 at which a transferred subfield image is formed is established such that the respective subfield images are contiguous with one another with no intervening spaces or the like. The respective positions of the subfield images relative to each other typically correspond to the respective positions of the corresponding subfields on the reticle 10. As noted above, this alignment of individual subfield images on the substrate 23 is achieved by appropriate deflections of the patterned beam by the imaging-position deflector 16 (FIG. 5). The subfield images as formed on the substrate 23 lack intervening grillage and skirts. To eliminate the grillage and skirts, the respective transfer position of each subfield image is appropriately shifted by an amount that corresponds to the combined widths of the non-patterned skirt 43 and minor strut 45 associated with the respective membrane portion 41 on the reticle.

This positional adjustment of subfield images on the substrate 23 must be performed in both the X and Y directions, and is achieved by appropriate deflections of the patterned beam as mediated by the imaging-position deflector 16. To such end, the deflector 16 actually includes separate respective deflectors for each of the X- and Y-directions.

Microelectronic-Device Fabrication Process

Figure 8:
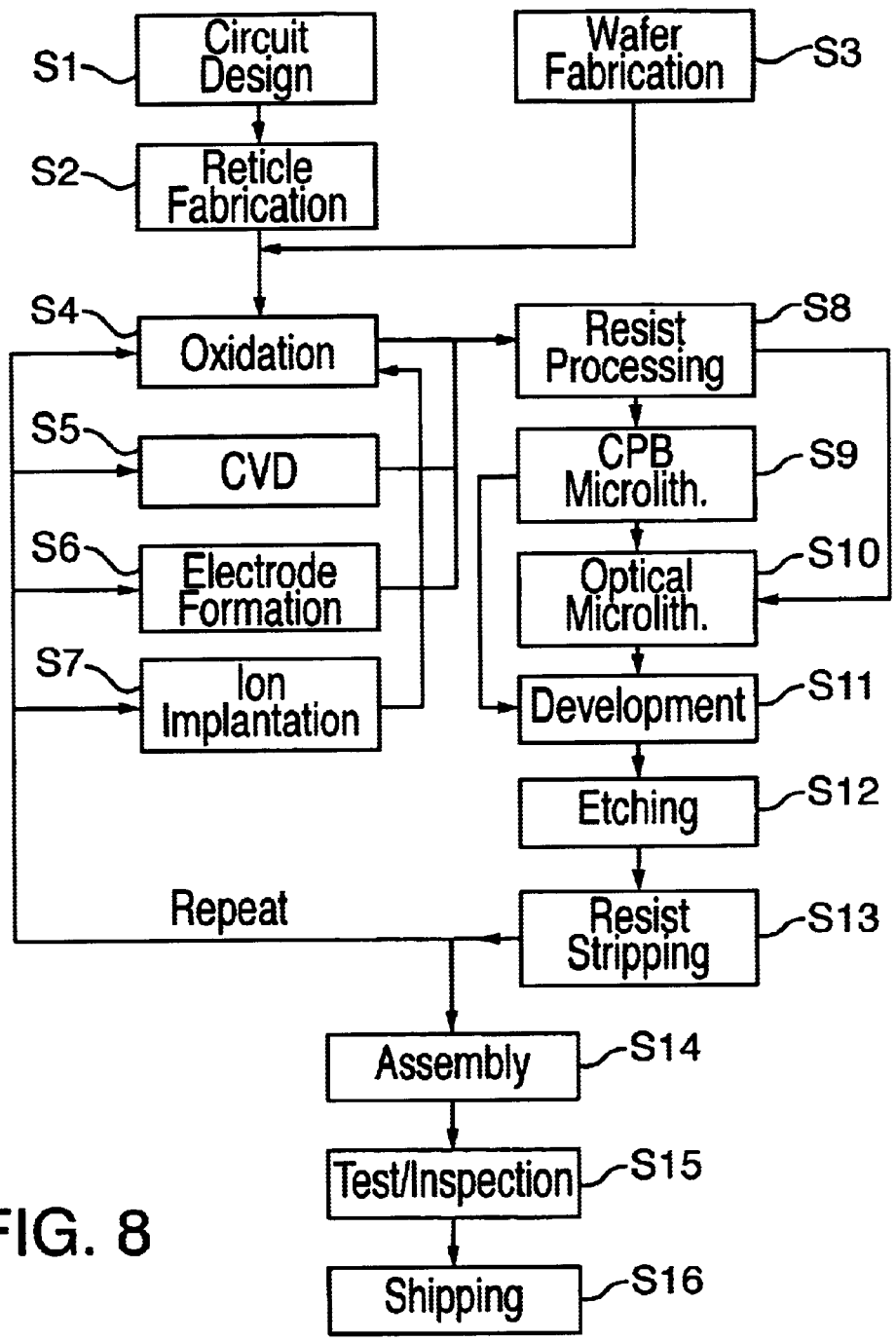
FIG. 8 is a flowchart of certain steps in a fabrication method for producing microelectronic devices (e.g., semiconductor chips such as ICs or LSI devices; displays such as liquid-crystal-panel displays; image sensors such as CCD devices; thin-film magnetic heads; or micromachines).

FIG. 8 is a flow chart of steps in a process for manufacturing a microelectronic device such as a semiconductor chip (e.g., an integrated circuit or LSI device), a display panel (e.g., liquid-crystal panel), charged-coupled device (CCD), thin-film magnetic head, micromachine, for example. In step S1, the circuit for the device is designed. In step S2 a reticle ("mask") for the circuit is manufactured. In step S2, local resizing of pattern elements can be performed to correct for proximity effects or space-charge effects during exposure. In step S3, a wafer is manufactured from a material such as silicon.

Steps S4–S13 are directed to wafer-processing steps, in which the circuit pattern defined on the reticle is transferred onto the wafer by microlithography. Step S14 is an assembly step (also termed a "post-process" step) in which the wafer that has been passed through steps S4–S13 is formed into semiconductor chips. This step can include, e.g., assembling the devices (dicing and bonding) and packaging (encapsulation of individual chips). Step S15 is an inspection step in which any of various operability and qualification tests of the device produced in step S14 are conducted. Afterward, devices that successfully pass step S15 are finished, packaged, and shipped (step S16).

Steps S4–S13 also provide representative details of wafer processing. Step S4 is an oxidation step for oxidizing the surface of a wafer. Step S5 involves chemical vapor deposition (CVD) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. Step S9 involves microlithographically exposing the resist using a charged particle beam to as to imprint the resist with the reticle pattern of the reticle produced in step S2. In step S9, a CPB microlithography apparatus as described above can be used. Step S10 involves microlithographically exposing the resist using optical microlithography. This step also can be performed using a reticle produced in step S2 can be used. Before or after this step, an exposure can be performed that serves to correct proximity effects. Step S11 involves developing the exposed resist on the wafer. Step S12 involves etching the wafer to remove material from areas where developed resist is absent. Step S13 involves resist separation, in which remaining resist on the wafer is removed after the etching step. By repeating steps S4–S13 as required, circuit patterns as defined by successive reticles are formed superposedly on the wafer.

General Discussion of Exposure Method

In general, a microlithographic exposure according to the invention requires that a device pattern be "defined" (formed) on a divided reticle. The reticle can be either a stencil reticle (also termed a "scattering-stencil" reticle) or a scattering-membrane reticle. As discussed above, a scattering-stencil reticle includes a reticle membrane that is highly scattering to incident charged particles passing through it. The membrane defines apertures (through-holes) that transmit incident charged particles with substantially no scattering. On such a reticle the pattern is defined by the collective arrangement of apertures and intervening regions of the highly scattering reticle membrane. As discussed above, a scattering-membrane reticle includes a reticle membrane that is slightly scattering to incident charged particles passing through it. Defined on the membrane are regions of a layer of a highly scattering material. On such a reticle the pattern is defined by the collective arrangement of regions containing only the weakly scattering membrane and intervening regions consisting of the reticle membrane and the highly scattering layer. Hence, depending upon the type of reticle, the pattern is defined on the reticle by a corresponding arrangement of non-scattering (if the reticle is a scattering-stencil reticle) or weakly scattering (if the reticle is a scattering-membrane reticle) regions versus highly scattering regions.

During exposure, a selected region (e.g., subfield) of the reticle is illuminated with the illumination beam. Most of the beam transmitted through highly-scattering regions is blocked by the contrast aperture, thereby preventing the highly scattered particles from reaching the sensitive substrate. Portions of the illumination beam transmitted through the non-scattering (or weakly scattering) regions pass through the contrast aperture and are focused as a corresponding projected image on the sensitive substrate.

According to a first exemplary embodiment of the method, during exposure of a pattern for a layer on the substrate, the beam current actually reaching the substrate, as a proportion of the beam current actually passing through the reticle (regarded as a 100% beam current), is reduced to 50% or less during exposure of the pattern. This reduction can be achieved by appropriately establishing the tone of the non-scattering (or weakly scattering) regions versus the tone of the highly scattering regions on the reticle, and appropriately using a positive-type or negative-type resist on the substrate. With a positive-type resist, non-exposed regions remain durable, and exposed regions become corresponding openings in the resist. With a negative-type resist, exposed regions become durable and non-exposed regions become corresponding openings in the resist.

For example, obtaining a beam current reaching the reticle of 50% or less can be achieved by establishing the total area of non-scattering (or weakly scattering) regions on the reticle, relative to the total patterned area of the reticle, at 50% or less for the entire layer. The "total patterned area" is the total area of non-scattering (or weakly scattering) regions plus the total area of highly scattering regions. The ratio is termed herein the "opening ratio," which is also the "pattern-element density" for the layer.

In CPB microlithography, as described above, the Coulomb effect should be reduced as much as possible. This end can be achieved by appropriately selecting the resist-image tone on the substrate and by configuring the pattern, as defined on the reticle, so as to correspond to a dark-field image of the pattern. For example, assuming a constant beam current illuminating the reticle, the Coulomb effect can be reduced by reducing the beam current on the substrate. If the reticle is a scattering-stencil reticle, beam current at the substrate can be reduced by correspondingly reducing the opening ratio of the pattern as defined on the reticle. However, if the pattern on the reticle is inverted in terms of which regions are "positive" and "negative" regions, respectively, then the tone of the image formed on the resist is inverted. Under such conditions the tone of the resist on the substrate also is inverted to obtain the desired imprinted image.

For example, for a given layer-pattern to be transferred from a reticle to the substrate, the tone (normal or inverted) of the non-scattering or weakly scattering regions of the reticle can be selected to yield a reduced beam current on the substrate. On a reticle defining a normal-tone pattern, elements corresponding to respective units of remaining resist on the substrate are defined as respective non-scattering or weakly scattering regions. On the reticle defining an inverted-tone pattern, elements corresponding to respective units of remaining resist on the substrate are defined as respective highly scattering regions. Accompanying this selection at the reticle, the tone (positive or negative) of the resist on the substrate is selected accordingly. As a result, image deterioration due to the Coulomb effect is reduced correspondingly.

Although a stencil-type reticle is more favored for use in CPB reduction microlithography, a stencil-type reticle cannot define all types of pattern elements. For example, a stencil-type reticle cannot define "doughnut"-shaped pattern elements or certain (especially long) cantilevered pattern elements. (Shorter cantilevered elements can be defined on a stencil-type reticle.) However, if doughnut and/or long, cantilevered elements are used to define critical elements, then the linewidth of such critical elements frequently cannot be controlled with sufficient accuracy and precision.

One way to solve this problem is to establish the resist tone (positive or negative) first, then fabricate a stencil-type reticle having a tone (normal or inverted) appropriate for the resist tone. If this solution leads to an undesirable reduction in throughput, then it is desirable first to establish a reticle tone appropriate for use with the stencil-type reticle, then to select the resist tone (positive or negative) appropriate for the tone of the pattern defined on the reticle.

According to a second exemplary embodiment, pattern regions including pattern elements for critical features in the subject layer are identified. With respect to such regions, the beam current actually reaching the substrate, as a proportion of the beam current actually passing through the reticle (regarded as a 100% beam current), is reduced to 50% or less during exposure of the pattern. This reduction can be achieved by appropriately establishing the tone of the non-scattering (or weakly scattering) regions versus the tone of the highly scattering regions on the reticle, and appropriately selecting a positive-type or negative-type resist on the substrate. In this embodiment, the beam current reaching the substrate from critical-feature-containing regions of the reticle is established at 50% or less. This can be achieved by establishing the total area of non-scattering (or weakly scattering if the reticle is a scattering-membrane reticle) regions on the reticle, relative to the total patterned area of the reticle, at 50% or less for the entire critical-feature-defining region in the subject layer.

The entire pattern for a layer of a microelectronic device usually includes regions in which the pattern-element density is high and other regions in which the pattern-element density is low. High-density regions can include pattern elements defining critical features (e.g., gates) of the pattern. For example, it is possible for critical-feature-defining regions to have a pattern-element density greater than 50%, even though the pattern-element density for the overall pattern is 50% or less. If a microlithographic exposure is performed using such a reticle, the Coulomb effect tends to be relatively large in the critical-feature regions as imaged on the substrate, resulting in unsatisfactory resolution in the critical-feature regions that should have the highest resolution.

To solve the problem summarized in the preceding paragraph, it was discovered that it was sufficient simply to reduce the pattern-element density in the critical-feature region to 50% or less. In stating this, it is understood that there may be instances in which the pattern-element density exceeds 50% in non-critical-feature regions (e.g., peripheral regions of the pattern). However, obtaining high resolution in such non-critical-feature regions is less important than in critical-feature regions. Hence, slightly reduced resolution in non-critical-feature regions from the Coulomb effect usually is not a problem. Appropriately selecting the tone of the scattering-stencil reticle and the tone of the resist image to achieve the desired pattern-element density in the critical-feature regions is performed similarly to making such a selection in situations in which the reticle tone and resist tone are selected for the layer as a whole.

In the method summarized in the preceding paragraph, if the reticle is a scattering-stencil reticle, changing the reticle tone may not be achievable with a single reticle. In such an instance, the pattern can be split between two complementary reticles. Alternatively, the pattern can be defined on a single scattering-membrane reticle instead of a scattering-stencil reticle.

In other words, in situations in which reduction of the pattern-element density to 50% or less is desired, it may not be possible to define the entire pattern on a single scattering-stencil reticle. For example, in a pattern region containing an array of critical features (critical elements) configured as lines and spaces, elements corresponding to respective units of resist on the substrate must be defined as respective non-scattering apertures in the reticle membrane. If these elements were defined on the reticle as respective electron-scattering regions, the electron-scattering regions would be surrounded by respective voids in the reticle membrane and thus would be unsupported. In such an instance, splitting of the reticle into two complementary scattering-stencil reticles or use of a single scattering-membrane reticle is indicated. Splitting of the reticle into complementary scattering-stencil reticles and exposing the layer from the two reticles rather than from a single reticle can reduce throughput. On the other hand, exposing the layer from two complementary scattering-stencil reticles can provide higher pattern-transfer resolution than exposing from scattering-membrane reticle.

Exposing a pattern from a scattering-membrane reticle requires more time than exposing a pattern from a scattering-stencil reticle. The longer exposure time is due to the generally reduced transmissivity of the membrane of a scattering-membrane reticle to charged particles of the illumination beam. (But, throughput typically is less reduced than the reduction in throughput experienced when using complementary scattering-stencil reticles.) A scattering-membrane reticle also produces more beam blur than a scattering-stencil reticle due to chromatic aberration accompanying a loss of beam energy during passage through the membrane.

In a third representative embodiment, exposure is performed using the following exposure rule. The variable "$\eta$" is the mean pattern-element density of a subject pattern for a layer to be formed on the substrate, the variable "$\eta_{max}$" is the maximum pattern-element density (opening ratio) for the various subfields, and the variable "$\eta_{min}$" is the minimum pattern-element density for the various subfields. With such a reticle pattern, the reticle tone is normal and a negative resist is used in cases in which $(\eta_{max}+\eta_{min})/2 \leq 50\%$. On the other hand, the reticle tone is inverted and a positive resist is used in cases in which $(\eta_{max}+\eta_{min})/2 > 50\%$. This exposure rule yields a transferred pattern having highly resolved pattern elements, and is exemplified by the data tabulated in FIG. 4.

In the First Example in FIG. 4, $\eta_{max}=40\%$, and $\eta_{min}=30\%$, resulting in $(\eta_{max}+\eta_{min})/2=35\% \leq 50\%$. In this situation, according to the exposure rule noted above, the reticle pattern has normal tone, and a negative resist is used.

In the Second Example in FIG. 4, $\eta_{max}=60\%$, and $\eta_{min}=50\%$, resulting in $(\eta_{max}+\eta_{min})/2=55\% > 50\%$. In this situation, according to the exposure rule noted above, the tone of the reticle pattern is inverted, and a positive resist is used.

In the Third Example in FIG. 4, $\eta_{max}=70\%$, and $\eta_{min}=60\%$, resulting in $(\eta_{max}+\eta_{min})/2=65\% > 50\%$. In this situation, according to the exposure rule noted above, the tone of the reticle pattern is inverted, and a positive resist is used.

In a fourth representative embodiment, exposure is performed according to the following exposure rule. The variable "$\eta_c$" is the mean pattern-element density of the area(s) of the pattern in which critical features are defined, the variable "$\eta_{cmax}$" is the maximum pattern-element density for the subfields defining critical feature(s), and the variable "$\eta_{cmin}$" is the minimum pattern-element density for the subfields defining critical feature(s). With such a reticle pattern, the reticle tone is normal and a negative resist is used in cases in which $(\eta_{cmax}+\eta_{cmin})/2 \leq 50\%$. On the other hand, the reticle tone is inverted, and a positive resist is used in cases in which $(\eta_{cmax}+\eta_{cmin})/2 > 50\%$. By applying this exposure rule to regions of the pattern having critical features, the Coulomb effect in such regions is reduced, and pattern-transfer resolution correspondingly improved.

In either of the third and fourth representative embodiments, exposure also can be performed, according to the respective exposure rules, for complementary patterns formed by splitting a reticle into complementary reticles (e.g., splitting of a scattering-stencil reticle into first and second complementary reticles). If, as a result of complementary splitting, the pattern is divided approximately evenly, then the opening ratio of substantially all portions of each reticle will be 50% or less. Under these conditions, each reticle can have normal tone, and a negative resist can be used.

In any of the foregoing embodiments the pattern-element density also can be controlled by incorporating in the reticle "dummy" elements or elements that are too fine to be resolved during exposure.

Regarding reticle tone or resist tone, it is comprehended that certain conditions may require selection of a tone that is contrary to the tone selected according to any of the embodiments described above. An example situation is one in which positive features should be configured as corresponding negative features due to certain characteristics of the particular resist being used or due to insufficient rigidity of a positive-tone or negative-tone reticle. In such instances, the opening ratio of the reticle can be regulated somewhat by disposing dummy elements (unnecessary pattern elements) that are independent of a microelectronic-device pattern (e.g., an integrated circuit pattern) or by disposing unresolvable pattern elements that are too fine to be resolved. However, if the opening ratio substantially exceeds 50% before making such an adjustment, either of these remedies usually cannot reduce the opening ratio to 50% or less. Another situation preventing such remedies is one in which, for example, an opening ratio of approximately 10% prior to adjustment is changed to a ratio exceeding 50%. However, a Coulomb effect generated under the latter condition would be acceptable so long as the desired resolution could be obtained.

The following examples are provided to augment the disclosure but are not intended to be limiting in any way.

EXAMPLE 1

Figure 1:
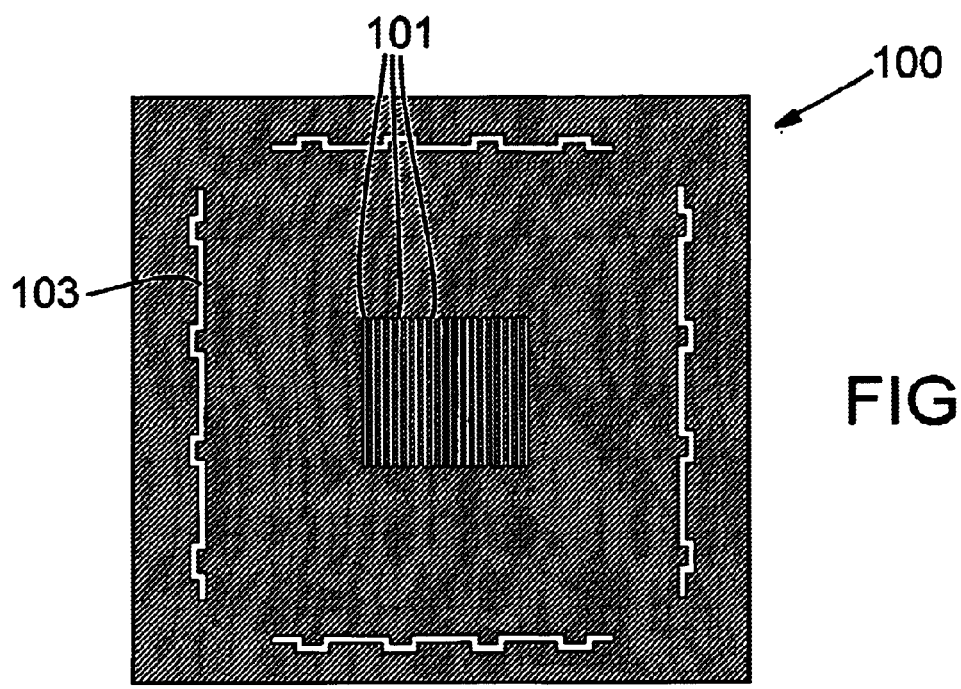
FIG. 1 is a plan view of a subfield of a pattern for a gate layer, as defined in a scattering-stencil reticle and as discussed in Example 1.

This example pertains to exposure of a gate layer for an integrated circuit logic device (e.g., memory chip) having a 70-nm node (gate) width. The gate layer is defined on a scattering-stencil reticle divided into subfields, which are exposed by electron-beam projection microlithography. FIG. 1 is a schematic diagram of one subfield 100 of a scattering-stencil reticle defining a pattern in which gate-layer elements are defined. In FIG. 1, the portions of the subfield membrane that are transmissive to electrons of the illumination beam are indicated by respective "white" regions denoting corresponding apertures in the subfield membrane through which electrons of the illumination beam pass with substantially no forward scattering. The pattern portion defined in the subfield 100 includes a central group of multiple parallel, linear pattern elements 101 as well as peripheral pattern elements 103.

The illumination beam passing through the pattern elements 101, 103 of the depicted subfield thus becomes a patterned beam carrying an aerial image of the pattern elements 101, 103. The patterned beam is "reduced" (demagnified) and projected onto a substrate (wafer) that is imprintable with the pattern.

In FIG. 1, the multiple linear elements 101 are gate elements. The target linewidth of the elements 101 is approximately 0.28 μm. The peripheral elements 103 surround the array of gate elements 101 in a manner allowing both sets of elements 101, 103 to be accommodated in a single subfield 100 having dimensions of 1 mm×1 mm square on the reticle. The elements 101, 103 are regions that, when the pattern is projected onto the substrate, correspond to respective units of negative resist on the substrate. The pattern-element density (opening ratio) in this subfield 100 is approximately 35%. In the overall layer pattern defined by this reticle, no regions other than regions defining the gate elements 103 have a relatively large pattern-element density. More specifically, in this example, the overall pattern-element density η of this layer (i.e., the opening ratio of this reticle) is approximately 10%.

The circuit pattern of this example consists only of the independent pattern elements 101, 103. Hence, consideration was given to whether the entire pattern would be defined on a single scattering-stencil reticle. From the information set forth above, $(\eta_{max}+\eta_{min})/2 \leq 50\%$. Accordingly, this reticle pattern can be defined on a single scattering-stencil reticle as a normal-tone pattern and used to expose a negative resist on the substrate.

In this example, the reticle was produced from a 6-inch diameter SOI wafer serving as a "reticle substrate." The reticle substrate was processed so as to form an array of multiple subfields separated from each other by major and minor struts, thereby forming a "reticle blank." The struts, formed by wet-etching and dry-etching, formed a grillage that separated the individual subfields from one another. The surface of the reticle blank (i.e., the membrane surface) was doped with boron by thermal diffusion so as to minimize imparting stress to the reticle blank. The membrane surface was then coated with an electron-sensitive resist (specifically ZEP520 resist) to a thickness of 0.5 μm. A 4× image of the circuit pattern was formed on the resist using an EB direct-writer. Using the resist pattern as an etching mask, the membrane was etched to produce the corresponding scattering-stencil reticle defining the pattern.

The reticle was mounted in a prototype EB stepper, manufactured by Nikon Corporation, configured to transfer the pattern at a ¼ demagnification ratio to a sensitized wafer. The lithography specifications were: 100 kV electron-beam-acceleration voltage, and 0.25-mm square exposure area per subfield on the wafer. The substrate was an 8-inch diameter Si wafer (P-type, having a resistivity of 4–6 Ω·cm, and having a (100) crystal-axis orientation). Prior to exposure with the pattern on the reticle, the substrate already had been processed to define source/drain structures and element-separating structures (trenches) for separating gates from respective sources and drains.

For imprinting with the pattern defined on the reticle, the substrate was coated with a resist (NEB series, chemically amplified negative-type resist manufactured by Sumitomo Chemical Co., Ltd., Japan) to a thickness of 0.3 μm. The resist was pre-baked, and the wafer was conveyed to the EB-microlithography apparatus and mounted on a wafer (substrate) stage. The reticle was conveyed to the EB-microlithography apparatus and mounted on a reticle stage. The wafer and reticle were aligned with each other, and the pattern was exposed subfield-by-subfield. At 100 kV, the optimal exposure dose was approximately 30 μC/cm$^2$. The beam current on the reticle was 15 μA. Since the opening ratio of the reticle was approximately 10% (see above), the mean beam current on the wafer was about 1.5 μA. This beam current on the wafer was sufficiently low that no deterioration of pattern-element resolution due to the Coulomb effect was evident. A subfield such as that shown in FIG. 1 has an opening ratio of approximately 35%, which yields a beam current on the wafer of about 5.25 μA. Again, this beam current was sufficiently low that significant deterioration of pattern-element resolution due to the Coulomb effect was not observed.

EXAMPLE 2

This example also pertains to exposing a gate layer for an integrated circuit logic device (e.g., memory chip) having a 100-nm node width. A subfield 110 of the reticle is shown schematically in FIG. 2.

Figure 2:
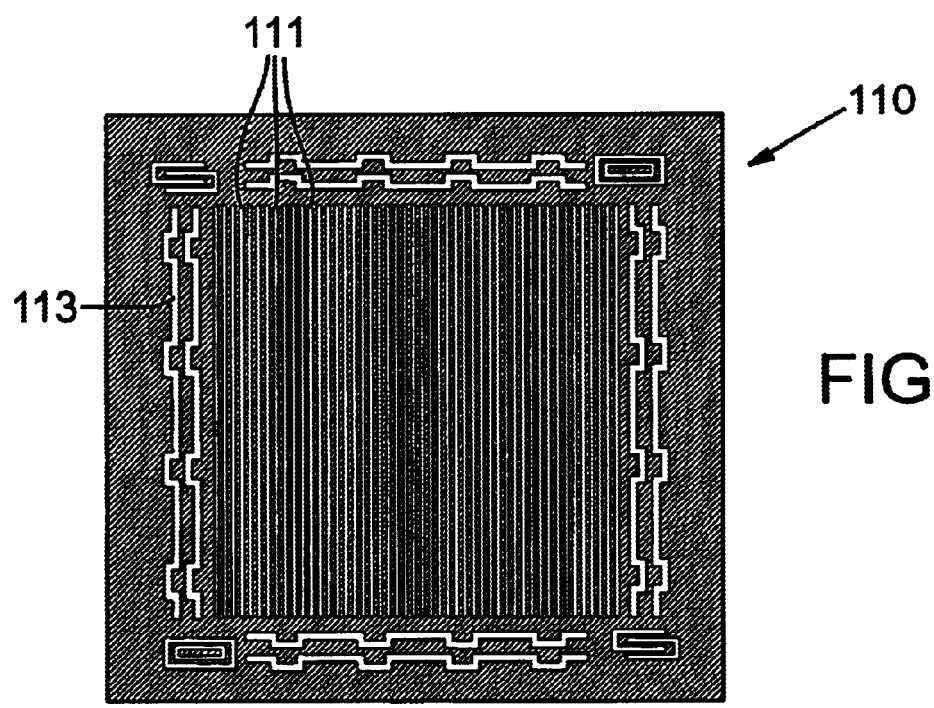
FIG. 2 is a plan view of a subfield of a pattern for a gate layer, as defined in a scattering-stencil reticle and as discussed in Example 2, before splitting into complementary subfields.

In FIG. 2, the portions of the subfield membrane that are transmissive to electrons of the illumination beam are indicated by respective "white" regions. These white regions are corresponding apertures in the subfield membrane, through which electrons of the illumination beam pass with substantially no forward scattering. Hence, the reticle is a scattering-stencil reticle. The pattern portion defined in the subfield 110 includes a central group of multiple parallel, linear pattern elements 111 as well as peripheral pattern elements 113. Note that the linear pattern elements 111 fill substantially more of the subfield 110 than the linear pattern elements 101 in the subfield shown in FIG. 1. Note also that, in FIG. 2, the peripheral pattern elements 113 are more complex than the peripheral elements 103 shown in FIG. 1.

The illumination beam passing through the pattern elements 111, 113 thus becomes a patterned beam carrying an aerial image of the pattern elements 111, 113. The patterned beam is "reduced" (demagnified) and projected onto a substrate (wafer) that is imprintable with the pattern.

In FIG. 2, the multiple linear elements 111 are gate elements and hence are critical features of the pattern. The target linewidth of the elements 111 is approximately 0.28 μm. The peripheral elements 113 surround the array of gate elements 111 in a manner allowing both sets of elements 111, 113 to be accommodated in a single subfield 110 having dimensions of 1 mm×1 mm square on the reticle. The elements 111, 113 are regions that, when the pattern is projected onto the substrate, correspond to respective units of negative resist on the substrate. The pattern-element density (opening ratio) of the elements 111, 113 in this subfield 110 is approximately 56%. The overall pattern-element density η of the layer is approximately 40%.

In this example, if the reticle tone and the resist tone were established base on the opening ratio in the layer as a whole, then the pattern-element density in pattern portions containing critical elements would remain in excess of 50%. Coulomb effects in such pattern portions, as projected onto the wafer, likely would be excessive. However, the configuration of the elongated linear elements 111 allows the reticle to be split readily into first and second complementary reticles. By splitting the elements between two complementary subfields, the elements are divided between the first and second complementary portions. For each subfield otherwise containing such gate elements, a respective subfield in the first complementary reticle defines a first portion of the respective gate elements, and a respective subfield in the second complementary reticle defines the remaining portion of the respective gate elements. Such splitting reduces the pattern-element density (opening ratio) in each subfield of either complementary reticle by approximately half, and thus reduces the opening ratio in each complementary reticle by at least half compared to the reticle containing the subfield shown in FIG. 2.

Figure 3A:
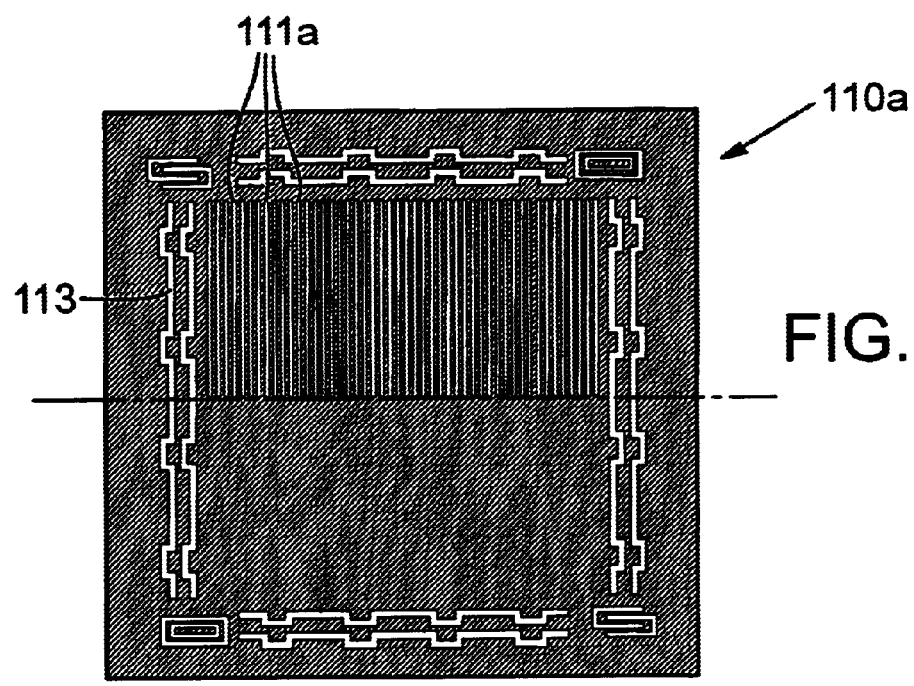
FIG. 3(A) is a plan view of a first complementary subfield prepared by splitting of the subfield shown in FIG. 2, according to Example 2. The depicted subfield contains the peripheral elements and an "upper" half of the gate elements shown in the subfield of FIG. 2, and thus has slightly more than half the pattern-element density of the subfield of FIG. 2.
Figure 3B:
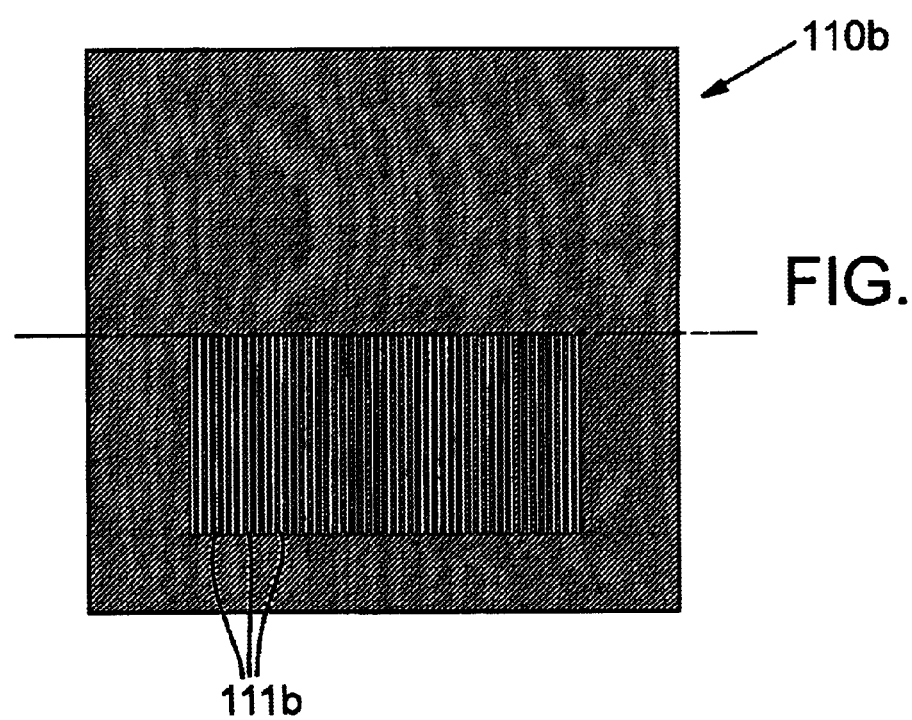
FIG. 3(B) is a plan view of a second complementary subfield prepared by splitting of the subfield shown in FIG. 2, according to Example 2. The depicted subfield contains the "lower" half of the gate elements shown in the subfield of FIG. 2, and thus has slightly less than half the pattern-element density of the subfield of FIG. 2.

Thus, two complementary scattering-stencil reticles were prepared. By way of example, FIGS. 3(A)–3(B) depict a particular subfield 110a as defined on the first complementary reticle, and a corresponding subfield 110b as defined on the second complementary reticle. In the subfield 110a of FIG. 3(A), only half of each gate element 111 in FIG. 2 is present in the depicted set of gate-element portions 111a. The subfield 110a also defines the peripheral elements 113. In the subfield 110b of FIG. 3(B), the remaining half of each gate element 111 is present in the depicted set of gate-element portions 111b. As a result, in each subfield 110a, 110b, the pattern-element density is approximately half the pattern-element density of the subfield 110 in FIG. 2.

After performing complementary splitting as shown in FIGS. 3(A)–3(B), the opening ratio of the layer as a whole was 20%, and the opening ratio of the gate elements only was approximately 28%. In the reticle having subfields configured as shown in FIG. 2, in contrast, the opening ratio of the gate elements was more than 50%. By using complementary reticles such as shown in FIGS. 3(A)–3(B), it is possible for the opening ratio of each complementary reticle to be much less than 50%, which contributes greatly to reducing Coulomb effects during exposure. Furthermore, by using complementary reticles, the reticle pattern can be defined as a normal-tone pattern if the surface adjustment method circuit pattern parts are set as parts through which the electron beam passes. A negative-tone resist can be used in this instance.

In this example, each complementary reticle was produced from a respective 6-inch diameter SOI wafer serving as a "reticle substrate." The reticle substrates were processed so as to form on each an array of multiple subfields separated from each other by major and minor struts, thereby forming respective "reticle blanks." The struts, formed by wet-etching and dry-etching, formed a grillage that separated the individual subfields from one another. The surface of each reticle blank (i.e., the membrane surface) was doped with boron by thermal diffusion so as to minimize imparting stress to the reticle blank. The membrane surface of each reticle blank was then coated with an electron-sensitive resist (specifically ZEP520 resist) to a thickness of 0.5 $\mu$m. A 4× image of the respective complementary circuit pattern was formed on the resist using an EB direct-writer. Using the resist pattern as an etching mask, the membrane of each reticle blank was etched to produce the corresponding scattering-stencil reticle defining the respective complementary pattern.

The scattering-stencil reticles were mounted on a reticle stage in a prototype EB stepper, manufactured by Nikon Corporation, configured to transfer the pattern from each reticle at a ¼ demagnification ratio to a sensitized wafer. The lithography specifications were: 100 kV electron-beam-acceleration voltage, and 0.25-mm square exposure area per subfield on the wafer. The substrate was an 8-inch diameter Si wafer (P-type, having a resistivity of 4–6 $\Omega$·cm, and having a (100) crystal-axis orientation). Prior to exposure with a reticle, the substrate already had been processed to define source/drain structures and element-separating structures (trenches) for separating gates from respective sources and drains.

For imprinting with the respective complementary patterns defined on the reticles, the substrate was coated with a resist (NEB series, chemically amplified negative-type resist manufactured by Sumitomo Chemical Co., Ltd., Japan) to a thickness of 0.3 $\mu$m. The resist was pre-baked, and the wafer was conveyed to the EB-microlithography apparatus and mounted on a wafer (substrate) stage. The reticles were conveyed to the EB-microlithography apparatus and mounted on a reticle stage. The wafer and each individual reticle were aligned with each other, and the respective patterns were exposed subfield-by-subfield. At 100 kV, the optimal exposure dose was approximately 30 $\mu$C/cm². The beam current on the reticle was 15 $\mu$A. Since the opening ratio of each reticle was approximately 20% (see above), the beam current on the wafer was about 3.0 $\mu$A. This beam current on the wafer was sufficiently low that no deterioration of pattern-element resolution due to the Coulomb effect was evident. With respect to a subfield such as that shown in FIG. 3(A), the opening ratio was approximately 28%, which yields a beam current on the wafer of about 4.2 $\mu$A. Again, this beam current was sufficiently low that significant deterioration of pattern-element resolution due to the Coulomb effect was not observed.

Whereas the invention has been described in connection with representative embodiments and examples, it will be understood that the invention is not limited to those embodiments and examples. On the contrary, the invention is intended to encompass all modifications, alternatives, and equivalents as may be included within the spirit and scope of the invention, as defined by the appended claims.

What is claimed is:

1. In a method for performing charged-particle-beam (CPB) microlithography in which a pattern for a layer of a microelectronic device to be formed on a substrate, sensitized by having a layer of resist, is defined on a segmented reticle that is either a scattering-stencil reticle or a scattering-membrane reticle, and selected regions of the reticle are individually illuminated with a CPB illumination beam to produce a corresponding patterned beam, wherein most of the charged particles in the patterned beam that are highly scattered during passage through the reticle are blocked by a contrast aperture from reaching the sensitive substrate, while charged particles that are not scattered and weakly scattered during passage through the reticle pass through the contrast aperture and are focused as a projected image on the sensitive substrate, a method for reducing Coulomb effects on the projected image, comprising:

for exposing the pattern, reducing a beam current of the patterned beam reaching the sensitive substrate, relative to a beam current actually passing through the reticle, to 50% or less by performing the steps of (a) establishing the pattern, as defined on the reticle, as a normal-tone pattern or as an inverted-tone pattern; and (b) establishing the resist on the substrate as a positive or negative resist.

2. The method of claim 1, wherein the reticle is a scattering-stencil reticle, in which the pattern elements are defined by respective non-scattering, CPB-transmissive apertures in a highly CPB-scattering reticle membrane.

3. The method of claim 2, wherein:

the beam current reaching the sensitive substrate is reduced by establishing an opening ratio of 50% or less for the pattern as a whole as defined on the reticle; and the opening ratio is expressed as $100[A_o/(A_o+A_{hs})]$, wherein $A_o$ is a total area of the reticle occupied by the non-scattering apertures in the reticle membrane, and $A_{hs}$ is a total area of the reticle occupied by the highly scattering reticle membrane.

4. The method of claim 1, wherein the reticle is a scattering-membrane reticle, in which pattern elements are defined by respective voids in a highly CPB-scattering layer on a weakly CPB-scattering yet CPB-transmissive reticle membrane.

5. The method of claim 4, wherein:

the beam current reaching the sensitive substrate is reduced by establishing an opening ratio of 50% or less for the pattern as a whole as defined on the reticle; and the opening ratio is expressed as $100[A_{ws}(A_{ws}+A_{hs})]$, wherein $A_{hs}$ is a total area of the reticle occupied by both the weakly scattering reticle membrane and the highly scattering layer, and $A_{ws}$ is a total area of the reticle occupied by only the weakly scattering reticle membrane.

6. The method of claim 2, wherein, if the pattern as defined on the reticle cannot be established as a normal-tone or inverted-tone pattern so as to reduce the beam current to 50% or less, then either: (i) splitting the reticle into multiple complementary reticles each defining a respective portion of the pattern, or (ii) defining the pattern using a scattering-membrane reticle.

7. A method for performing charged-particle-beam (CPB) microlithography of a pattern, defined on a reticle, to a sensitive substrate, the method comprising:

defining the pattern on a segmented reticle that is either a scattering-stencil reticle or a scattering-membrane reticle;

individually illuminating selected regions of the reticle with a CPB illumination beam to produce a corresponding patterned beam;

blocking at least most of the charged particles in the patterned beam that are highly scattered during passage through the reticle from reaching the sensitive substrate, and focusing charged particles that are not scattered and that are weakly scattered during passage through the reticle as a projected image on the sensitive substrate; and with respect to regions of the reticle defining critical features of the pattern, reducing a beam current of the patterned beam reaching the sensitive substrate, relative to a beam current actually passing through the reticle, to 50% or less by performing the steps of (a) establishing the pattern, as defined on the reticle, as a normal-tone pattern or as an inverted-tone pattern; and (b) establishing the resist on the substrate as a positive or negative resist.

8. The method of claim 7, wherein the reticle is a scattering-stencil reticle, in which the pattern elements are defined by respective non-scattering, CPB-transmissive apertures in a highly CPB-scattering reticle membrane.

9. The method of claim 8, wherein, with respect to regions of the reticle defining critical features of the pattern:

the beam current reaching the sensitive substrate is reduced by establishing an opening ratio of 50% or less for the pattern as a whole as defined on the reticle; and the opening ratio is expressed as $100[A_o/(A_o+A_{hs})]$, wherein $A_o$ is a total area of the reticle occupied by the non-scattering apertures in the reticle membrane, and $A_{hs}$ is a total area of the reticle occupied by the highly scattering reticle membrane.

10. The method of claim 7, wherein the reticle is a scattering-membrane reticle, in which pattern elements are defined by respective voids in a highly CPB-scattering layer on a weakly CPB-scattering yet CPB-transmissive reticle membrane.

11. The method of claim 10, wherein, with respect to regions of the reticle defining critical features of the pattern:

the beam current reaching the sensitive substrate is reduced by establishing an opening ratio of 50% or less for the pattern as a whole as defined on the reticle; and the opening ratio is expressed as $100[A_{ws}/(A_{ws}+A_{hs})]$, wherein $A_{hs}$ is a total area of the reticle occupied by both the weakly scattering reticle membrane and the highly scattering layer, and $A_{ws}$ is a total area of the reticle occupied by only the weakly scattering reticle membrane.

12. The method of claim 8, wherein, if the pattern as defined on the reticle cannot be established as a normal-tone or inverted-tone pattern so as to reduce the beam current to 50% or less, then either: (i) splitting the reticle into multiple complementary reticles each defining a respective portion of the pattern, or (ii) defining the pattern using a scattering-membrane reticle.

13. A method for performing charged-particle-beam (CPB) microlithography of a pattern, defined on a reticle, to a sensitive substrate, the method comprising:

defining the pattern on a segmented reticle that is either a scattering-stencil reticle or a scattering-membrane reticle, the reticle being divided into multiple subfields each defining a respective portion of the pattern;

individually illuminating the subfields with a CPB illumination beam to produce a corresponding patterned beam directed to the sensitive substrate;

blocking at least most of the charged particles in the patterned beam that are highly scattered during passage through the reticle from reaching the sensitive substrate, and focusing charged particles that are not scattered and that are weakly scattered during passage through the reticle as a projected image on the sensitive substrate;

stitching together the subfield images on the substrate so as to imprint a complete pattern on the substrate;

for exposing the pattern, reducing a beam current of the patterned beam reaching the sensitive substrate, relative to a beam current actually passing through the reticle, to 50% or less by performing the steps of (a) establishing the pattern, as defined on the reticle, as a normal-tone pattern or as an inverted-tone pattern; and (b) establishing the resist on the substrate as a positive or negative resist; and according to an exposure rule, defining the pattern in a normal tone on the reticle and using a negative resist on the substrate whenever $(\eta_{max}+\eta_{min})/2 \leq 50\%$, wherein $\eta$ is a mean pattern-element density for the entire pattern, $\eta_{max}$ is a maximum pattern-element density for each subfield, and $\eta_{min}$ is a minimum pattern-element density for each subfield, and defining the pattern in an inverted tone on the reticle and using a positive resist on the substrate whenever $(\eta_{max}+\eta_{min})/2 > 50\%$.

14. The method of claim 13, wherein, if the pattern as defined on the reticle cannot be established as a normal-tone or inverted-tone pattern, then splitting the reticle into multiple complementary reticles each defining a respective portion of the pattern.

15. The method of claim 14, further comprising the step of exposing each of the complementary reticles according to the exposure rule.

16. The method of claim 13, further comprising the step of changing the pattern-element density on the reticle by disposing dummy elements and/or unresolvable elements on the reticle.

17. A method for performing charged-particle-beam (CPB) microlithography of a pattern, defined on a reticle, to a sensitive substrate, the method comprising:

defining the pattern on a segmented reticle that is either a scattering-stencil reticle or a scattering-membrane reticle, the reticle being divided into multiple subfields each defining a respective portion of the pattern;

individually illuminating the subfields with a CPB illumination beam to produce a corresponding patterned beam directed to the sensitive substrate;

blocking at least most of the charged particles in the patterned beam that are highly scattered during passage through the reticle from reaching the sensitive substrate, and focusing charged particles that are not scattered and that are weakly scattered during passage through the reticle as a projected image on the sensitive substrate;

stitching together the subfield images on the substrate so as to imprint a complete pattern on the substrate;

with respect to subfields defining critical features of the pattern, reducing a beam current of the patterned beam reaching the sensitive substrate, relative to a beam current actually passing through the reticle, to 50% or less by performing the steps of (a) establishing the pattern, as defined on the reticle, as a normal-tone pattern or as an inverted-tone pattern; and (b) establishing the resist on the substrate as a positive or negative resist; and defining the pattern in a normal tone on the reticle and using a negative resist on the substrate whenever $(\eta_{cmax}+\eta_{cmin})/2 \leq 50\%$, wherein $\eta_c$ is a mean pattern-element density for all subfields of the pattern that include critical features, $\eta_{cmax}$ is a maximum pattern-element density for each subfield that includes critical features, and $\eta_{cmin}$ is a minimum pattern-element density for each subfield that includes critical features, and defining the pattern in an inverted tone on the reticle and using a positive resist on the substrate whenever $(\eta_{cmax}+\eta_{cmin})/2>50\%$.

18. The method of claim 17, wherein, if the pattern as defined on the reticle cannot be established as a normal-tone or inverted-tone pattern, then splitting the reticle into multiple complementary reticles each defining a respective portion of the pattern.

19. The method of claim 18, further comprising the step of exposing each of the complementary reticles according to the exposure rule.

20. The method of claim 17, further comprising the step of changing the pattern-element density on the reticle by disposing dummy elements and/or unresolvable elements on the reticle.

21. A method for manufacturing a microelectronic device, comprising a microlithography step performed according to the method recited in claim 1.

22. A microelectronic device, produced by a method as recited in claim 21.

23. A method for manufacturing a microelectronic device, comprising a microlithography step performed according to the method recited in claim 7.

24. A microelectronic device, produced by a method as recited in claim 23.

25. A method for manufacturing a microelectronic device, comprising a microlithography step performed according to the method recited in claim 13.

26. A microelectronic device, produced by a method as recited in claim 25.

27. A method for manufacturing a microelectronic device, comprising a microlithography step performed according to the method recited in claim 17.

28. A microelectronic device, produced by a method as recited in claim 27.

* * * * *

UNITED STATES PATENT AND TRADEMARK OFFICE
CERTIFICATE OF CORRECTION

PATENT NO. : 6,756,182 B2
DATED : June 29, 2004
INVENTOR(S) : Shimizu et al.

It is certified that error appears in the above-identified patent and that said Letters Patent is hereby corrected as shown below:

Column 9,
Line 63, "stage 1" should read -- stage 11 --.

Column 11,
Line 53, "to as to" should read -- so as to --.
Line 58, "in step S2 can be used." should read -- in step S2. --.

Signed and Sealed this

Twenty-fourth Day of May, 2005

JON W. DUDAS
*Director of the United States Patent and Trademark Office*